United States Patent [19]

Beernink et al.

[11] Patent Number: 5,436,193
[45] Date of Patent: Jul. 25, 1995

[54] METHOD OF FABRICATING A STACKED ACTIVE REGION LASER ARRAY

[75] Inventors: Kevin J. Beernink, Mountain View; Robert L. Thornton, East Palo Alto, both of Calif.

[73] Assignee: Xerox Corporation, Stamford, Conn.

[21] Appl. No.: 146,752

[22] Filed: Nov. 2, 1993

[51] Int. Cl.$^6$ ............................................. H01L 21/20
[52] U.S. Cl. ............................ 437/129; 148/DIG. 95
[58] Field of Search ................ 437/129; 148/DIG. 95

[56] References Cited

U.S. PATENT DOCUMENTS

| | | | |
|---|---|---|---|
| 4,982,408 | 1/1991 | Shimizu | 372/45 |
| 5,033,053 | 7/1991 | Shimizu et al. | 372/50 |
| 5,284,791 | 2/1994 | Sakata et al. | 437/129 |
| 5,293,392 | 3/1994 | Shieh et al. | 437/129 |

FOREIGN PATENT DOCUMENTS 139983  8/1982  Japan .................................. 437/129

OTHER PUBLICATIONS

Ikeda, S.; Shimizu, A.; and Hara, T. "Asymmetric Dual Quantum Well Laser-Wavelength Switching Controlled by Injection Current." Appl. Phys. Lett., vol. 55, No. 12, 18 Sep. 1989. Pp 1155–1157.

Ikeda, S.; and Shimizu, A. "Evidence of the Wavelength Switching Caused by a Blocked Carrier Transport in an Asymmetric Dual Quantum Well Laser." Appl. Phys. Lett., vol. 59, No. 5, 29 Jul. 1991. Pp. 504–506.

Primary Examiner—R. Bruce Breneman
Assistant Examiner—Linda J. Fleck

[57] ABSTRACT

A method of fabricating monolithic arrays having closely spaced laser stripes which output laser beams with large, but well-controlled, wavelength separations. The method begins by depositing on a substrate a lower cladding layer and a plurality of stacked active regions with different bandgaps and which are separated by etch stop layers. The stacked active regions are stacked in order of decreasing energy bandgaps as one moves away from the substrate. One or more stacks are then formed by etching one or more active layers using a patterned mask and the etch stop layers such that the topmost active region that remains in each stack has a bandgap which corresponds to the desired laser beam color from that stack. An upper cladding layer is then grown over the exposed surfaces. Beneficially, a lateral confinement region is then created around the stacks (such as by using impurity-induced layer disordering). Finally, a capping layer and metallic contacts are added to each stack, and a common metallic contact is added to the substrate.

10 Claims, 4 Drawing Sheets

| 111 | GaAs | p=2×10$^{19}$ | 1000a | CAP |
| --- | --- | --- | --- | --- |
| 110 | Al$_{0.85}$Ga$_{0.15}$As | p=10$^{18}$ | 0.6 um | CLADDING |
| 109 | Al$_{0.15}$Ga$_{0.85}$As | p=10$^{18}$ | 50 A | ESL1 (<730 nm) |
| 108 | Al$_{0.30}$Ga$_{0.70}$As | u | 900 A | |
| 107 | GaAs | u | 100 A | QW1 850 nm |
| 106 | Al$_{0.30}$Ga$_{0.70}$As | u | 250 A | |
| 105 | Al$_{0.85}$Ga$_{0.15}$As | u | 40 A | ESL2 |
| 104 | Al$_{0.15}$Ga$_{0.85}$As | u | 50 A | ESL3 (730 nm) |
| 103 | Al$_{0.40}$Ga$_{0.60}$As | u | 900 A | |
| 102 | Al$_{0.10}$Ga$_{0.90}$As | u | 80 A | QW2 780 nm |
| 101 | Al$_{0.40}$Ga$_{0.60}$As | u | 900 A | |
| 100 | Al$_{0.85}$Ga$_{0.15}$As | n=10$^{18}$ | 0.8 um | CLADDING |
| 98 | Al$_{0.40}$Ga$_{0.60}$As | n$^+$ | 2000 A | BUFFER LAYER |
| 96 | Al$_{0.15}$Ga$_{0.85}$As | n$^+$ | 2000 A | BUFFER LAYER |
| | GaAs | n$^+$ | | SUBSTRATE |

FIG. 2

METHOD OF FABRICATING A STACKED ACTIVE REGION LASER ARRAY

The U.S. Government has a paid-up license in the invention as provided by the terms of Advanced Technology Program Award 70NANB2H1241 awarded by the Department of Commerce.

This invention relates to methods of fabricating stacked active region laser arrays which output multiple laser beams having different color wavelengths.

BACKGROUND OF THE INVENTION

The performance of many devices, such as laser printers and optical memories, can be improved by the incorporation of multiple laser beams. For example, laser printers which use multiple beams can have higher printing speeds and/or better spot acuity than printers which use only a single beam.

In many applications, closely spaced laser beams of different colors (wavelengths) are desirable. For example, color printers which use closely spaced laser beams of different colors can overlap the beams, sweep those overlapping beams using a single raster output polygon scanner and a single set of optics, subsequently separate the individual beams using color selective filters, direct each beam onto a separate xerographic imaging station, develop a latent image for each color on a different recording medium, and produce a full color image by sequentially developing each latent image on a single recording medium.

One way to obtain closely spaced laser beams is to form multiple laser emission sites, or laser stripes, on a common substrate. While this enables very closely spaced beams, prior art monolithic laser arrays typically output laser beams at only one color.

However, various techniques are known in the prior art for producing different color laser beams from a monolithic laser array. For example, it is well known that a small amount of color difference can be obtained by varying the drive conditions at each lasing region. However, the easily achievable color difference is insufficient for most applications.

One method of achieving large wavelength separations is to grow a first set of active layers on a substrate to form a first lasing element which outputs light at one wavelength, and then to form a second set of active layers next to the first to form a second lasing element at a second wavelength. However, this method requires separate crystal growths for each lasing element, something which is not easily performed.

Another technique for obtaining different color laser beams from a monolithic laser array is to use stacked active regions. A stacked active region monolithic array is one in which a plurality of active regions are sandwiched between common cladding layers. Each active region is comprised of a thin volume that is contained within a laser stripe. The laser stripes contain different numbers of active regions that emit laser beams at different wavelengths. Several stacked active region structures are discussed in U.S. Pat. No. 5,157,680, entitled "Integrated Semiconductor Laser," issued 20 Oct. 1992 to Goto.

In a stacked active region monolithic laser array, current flows in series through the stacked active regions. The active region with the lowest bandgap energy will lase, thereby determining the color of the laser beam output from that part of the array. To provide another color output, the previously lowest bandgap energy active region is removed from part of the array and current is sent through the remaining stacked regions.

Stacked active region monolithic laser arrays can not only output closely spaced laser beams of different colors, but beneficially the output laser beams are axially aligned with each other (share the same optical axes). In practice, the stacked regions of a stacked active region monolithic laser array are very closely spaced; separations in the stack direction typically being about 100nm.

A big problem with stacked active region monolithic laser arrays is that they have been difficult to fabricate, particularly in the AlGaAs material system. This is at least partially because the proper stacked active regions must be formed in each part of the structure. Conceptually, this problem can be solved by simply growing planar epitaxial layers which contain the required active regions such that the bandgap energies of the active regions decrease as one moves towards the crystal surface. Then, one could simply remove active regions, as required, to obtain the desired wavelength from each region of the array. Finally, the required cladding layer and capping layers could be grown over the remaining active regions.

However, it is very difficult to precisely etch the areas between the active regions when those active regions are closely spaced. Further, because of undesired growths on many materials when those materials are exposed to air, such as oxide growths on some compositions of AlGaAs, it is very difficult to achieve the required high quality growths over the remaining active regions. Thus, the simple conceptual approach given above is difficult to implement in some material systems, for example those containing aluminum.

Therefore, it would be useful to have techniques for producing stacked active region structures capable of outputting closely spaced, multiple color laser beams in material systems which are subject to undesired oxidation upon exposure to the atmosphere prior to growth of overlayers.

SUMMARY OF INVENTION

An object of the invention is a technique for producing stacked active region structures capable of outputting closely spaced, multiple color laser beams.

Yet another object is a technique for producing stacked active region structures which requires only two epitaxial crystal growth steps.

A further object of the invention is a device capable of producing closely spaced, multiple color laser sources that are axially aligned with each other.

The invention relates to monolithic arrays, and techniques for fabricating such arrays, which have closely spaced laser stripes and which output laser beams with large, but well-controlled, wavelength separations. The resulting monolithic arrays produced using the inventive techniques have a plurality of stacked active regions which are stacked in the order of increasing energy bandgaps as one moves toward the substrate. Those active regions are separated by one or more thin etch stop layers. Between the bottom active regions and the substrate is a lower cladding layer, while over the topmost active region of each stack is an upper cladding layer. Beneficially, an electrical connection is made to each stack using a heavily doped capping layer metallic contact above each stack and a metallic contact on the substrate (which is shared by all stacks). Lateral carrier and optical confinement, for enhanced performance, is achieved using a confinement layer around each stack. Beneficially, that confinement layer is formed using impurity-induced layer disordering.

The method of fabricating such monolithic arrays is to first fabricate all active regions (in order of wavelength), lower cladding layer, etch stop layers, and if used, buffer layers, on a single substrate. Then, using patterned etching, the various active layers are etched from selected portions of the structure such that the top active region that remains in each stack will output the desired color. The etch stop layers enable the accurate removal of the undesired active regions without harm to the topmost remaining active region in each stack. Then the upper cladding layer and capping structure are grown over the topmost portions of the structure. Next, a lateral confinement region is created, beneficially using impurity-induced layer disordering. Finally, the metallic contacts are added to each stack and to the substrate.

The advantages of the invention will become more apparent from the following drawings and descriptions.

BRIEF DESCRIPTION OF THE DRAWINGS

FIG. 2 shows an intermediate structure used in the fabrication of the structure illustrated in FIG. 1, that intermediate structure is the one that exists prior to etching;

AN ILLUSTRATED EMBODIMENT

The present invention provides techniques for fabricating stacked active region monolithic arrays that are capable of outputting closely spaced, multiple color, axially aligned laser beams. A benefit of the present invention is that it enables stacked active region monolithic arrays in material systems, such as the $Al_xGa_{1-x}As$ material system, in which high quality growths are sometimes difficult to achieve, for example, growths on aluminum containing layers that have been exposed to the atmosphere. Another material system in which the present invention may find wide use is $In_xGa_yAl_{1-x-y}As$, wherein $0 \leq x \leq 1$ and $0 \leq y \leq 1$.

The following detailed description describes an embodiment of a stacked active region structure fabricated according to the present invention. First, a description of the structure itself is provided, and then a method of fabricating the structure is given. A description of the operation of the structure is given in a commonly assigned co-pending U.S. patent application Ser. No. 08/146,651, filed on 2 Nov. 1993 and entitled, "STACKED ACTIVE REGION LASER ARRAY FOR MULTICOLOR EMISSIONS," which is hereby incorporated by reference. It is to be understood that many other embodiments than the one illustrated are possible.

DESCRIPTION OF THE ILLUSTRATED EMBODIMENT

Figure 1:
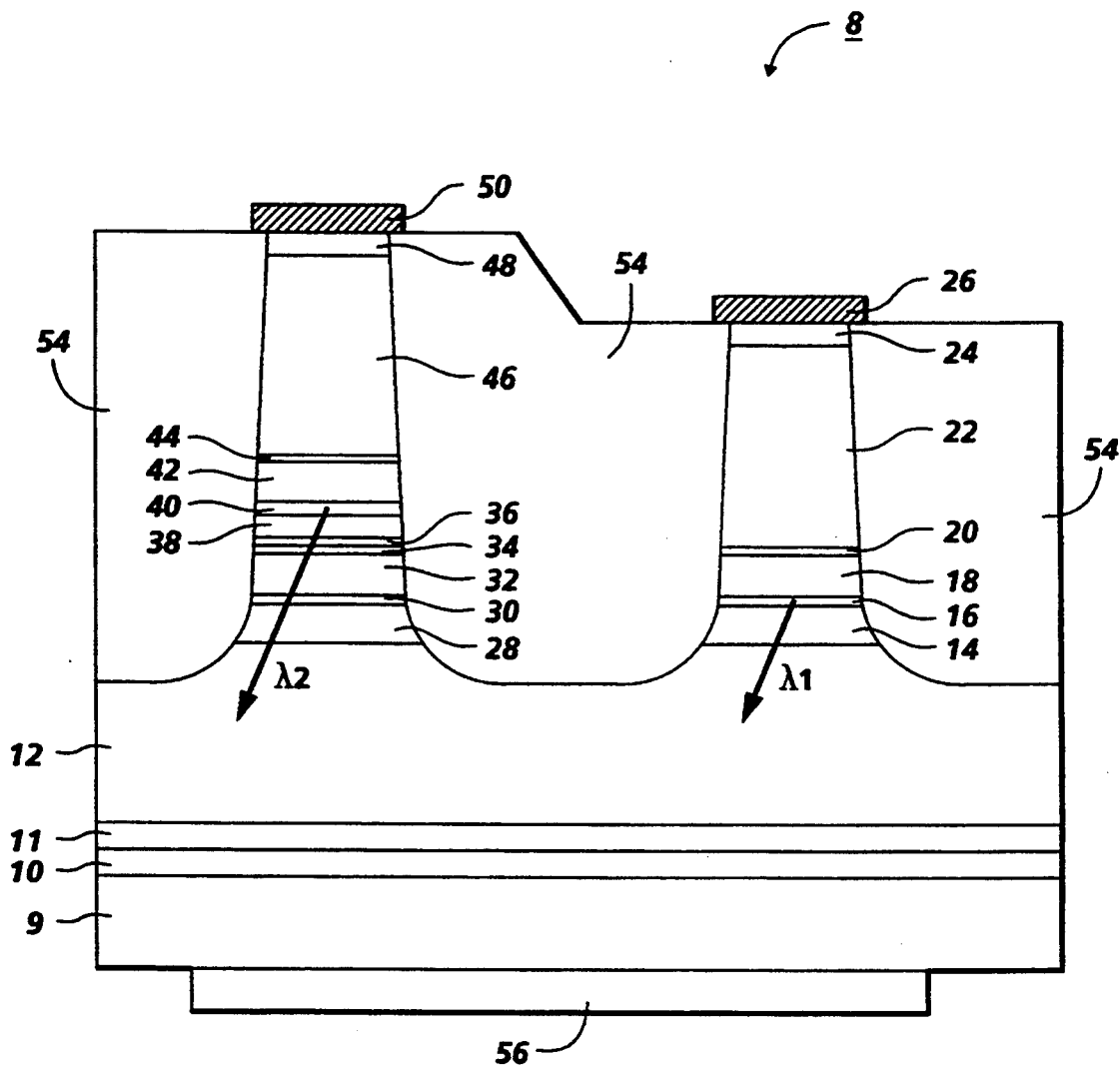
FIG. 1 is an unscaled schematic depiction of a cross-sectional view of a structure that is produced by the described embodiment of the invention.

FIG. 1 illustrates a simplified, stacked active region monolithic array 8 fabricated in accord with the principles of the invention. While the array 8 outputs only two laser beams, the principles of the invention can be applied to arrays which output additional laser beams.

The array 8 is a layered arrangement of $Al_xGa_{1-x}As$, GaAs, and metallic contacts. The use of $Al_xGa_{1-x}As$ on GaAs substrates is well-known for the production of lasers having wavelengths in the range of around 700 to 900 nm. The array 8 has a substrate 9 comprised of a GaAs base onto which are grown (using MOCVD) a 2000 Å thick buffer layer 10 of $Al_{0.15}Ga_{0.85}As$ followed by a 2000 Å thick $Al_{0.40}Ga_{0.60}As$ buffer layer 11, both of which are heavily doped ntype (doping greater than $10^{18}$ cm$^{-3}$). Over the buffer layer 11 is a 0.8 μm thick $Al_{0.85}Ga_{0.15}As$ lower cladding layer 12 which is doped to about n=$10^{18}$ cm$^{-3}$. Because the array 8 outputs two laser beams, two stacks of active regions and support layers are formed over the lower cladding layer 12. While the subsequently described first stack contains only one active region, and is therefore technically not a stacked active region, it will be referred to as a stack since, in other applications, it may contain more than one active region.

THE FIRST STACK

Still referring to FIG. 1, the first stack begins with an approximately 900 Å thick waveguide layer 14 of $Al_{0.40}Ga_{0.60}As$ over the lower cladding layer 12. Over the waveguide layer 14 is an 80 Å thick quantum well layer 16 of $Al_{0.10}Ga_{0.90}As$ (for emission at a first wavelength of 780 nm). Over the quantum well layer 16 is a 900 Å thick waveguide layer 18 of $Al_{0.40}Ga_{0.60}As$. The various layers 14, 16, 18 form a first active region.

Over the waveguide layer 18 is a 50 Å thick etch stop layer 20 that is comprised of $Al_{0.15}Ga_{0.85}As$. Over the etch stop layer 20 is an 0.6 pm thick $Al_{0.85}Ga_{0.15}As$ upper cladding layer 22 that is doped to about p=$10^{18}$ cm$^{-3}$. Over the upper cladding layer 22 is a 1000 Å thick capping layer 24 of GaAs which is doped to about p=$2 \times 10^{19}$ cm$^{-3}$. Finally, over the capping layer 24 is a metal contact 26 that provides electrical access to the first stack.

THE SECOND STACK

The second stack begins with an approximately 900 Å thick waveguide layer 28 of $Al_{0.40}Ga_{0.60}As$ over the lower cladding layer 12. Over the waveguide layer 28 is an 80 Å thick quantum well layer 30 of $Al_{0.10}Ga_{0.90}As$. Over the quantum well layer 30 is a 900 Å thick waveguide layer 32 of $Al_{0.40}Ga_{0.60}As$. The various layers 28, 30, and 32 form a second active region. Note that the first and second active regions are essentially the same in that the layers 28, 30, and 32 are the same as, respectively, layers 14, 16, 18. However, as subsequently explained, the second active region does not emit laser light.

Over the waveguide layer 32 is a 50 Å thick etch stop layer 34 comprised of $Al_{0.15}Ga_{0.85}As$. Note that the etch stop layers 20 and 34 are the same. Over the etch stop layer 34 is a 40 Å thick etch stop 36 comprised of $Al_{0.85}Ga_{0.15}As$.

A third active region is then formed over the etch stop 36. That third active region is formed from a 250 Å thick waveguide/separation layer 38 of $Al_{0.30}Ga_{0.70}As$. Over the waveguide/separation layer 38 is a 100 Å thick GaAs quantum well layer 40 for emission at 850 nm. Completing the third active layer is a 900 Å thick waveguide layer 42 of $Al_{0.30}Ga_{0.70}As$ over the GaAs layer 40.

Over the third active region is a 50 Å thick $Al0.1$-$5Ga_{0.85}As$ etch stop 44. Over the etch stop layer 44 is a 6000 Å thick $Al_{0.85}Ga_{0.15}As$ upper cladding layer 46 that is doped to about $p=10^{18}$ cm$^{-3}$. Over the upper cladding layer 46 is a 1000 Å thick capping layer 48 of GaAs which is doped to about $p=2\times10^{19}$cm$^{-3}$. Finally, over the capping layer 48 is a metal contact 50. Note that the upper cladding layer 46, capping layer 48, and metal contact 50 are similar to, respectively, the upper cladding layer 22, capping layer 24, and metal contact 26.

OTHER ELEMENTS OF THE ILLUSTRATED EMBODIMENT

Over the sections of the lower cladding 12 that are not part of either the first or second stacks are lateral confining regions 54. In the array 8, the confining regions 54 are formed by impurity-induced disordering. Finally, a common electric contact 56 provides a common electrical path for the first and second stacks.

FABRICATION OF THE STRUCTURE

Problems with prior art stacked active region monolithic arrays are frequently a result of the difficulties of precisely etching to the correct location between active regions, and of achieving high quality growths on the topmost surfaces after etching, particularly in material systems such as AlGaAs that tend to oxidize. Our solution to these problems is to incorporate "etch stop layers" between the stacked active regions that enable precise etching and subsequent high quality growths of the desired compositions. It is to be understood that while the following fabrication process describes the fabrication of only three active regions (only two of which are stacked) the fabrication process is easily expanded to include more stacked regions.

The initial step in fabricating the structure shown in FIG. 1 is to grow the structure shown in FIG. 2 using a suitable epitaxial crystal growth technique such as MOCVD. Growth of these layers is to be performed according to standard practices. Referring to FIG. 2, the following layers are grown, in the order given, on the substrate 9 of FIG. 1:

| Layer | Thickness | Composition | Reference Layers |
| --- | --- | --- | --- |
| 96 | 2000 Å | $Al_{0.15}Ga_{0.85}As$ | 10 |
| 98 | 2000 Å | $Al_{0.40}Ga_{0.60}As$ | 11 |
| 100 | 8000 Å | $Al_{0.85}Ga_{0.15}As$ | 12 |
| 101 | 900 Å | $Al_{0.40}Ga_{0.60}As$ | 14,28 |
| 102 | 80 Å | $Al_{0.10}Ga_{0.90}As$ | 16,30 |
| 103 | 900 Å | $Al_{0.40}Ga_{0.60}As$ | 18,32 |
| 104 | 50 Å | $Al_{0.15}Ga_{0.85}As$ | 20,34 |
| 105 | 40 Å | $Al_{0.85}Ga_{0.15}As$ | 36 |
| 106 | 250 Å | $Al_{0.30}Ga_{0.70}As$ | 38 |
| 107 | 100 Å | GaAs | 40 |
| 108 | 900 Å | $Al_{0.30}Ga_{0.70}As$ | 42 |
| 109 | 50 Å | $Al_{0.15}Ga_{0.85}As$ | 44 |
| 110 | 6000 Å* | $Al_{0.85}Ga_{0.15}As$ | None |
| 111 | 1000 Å* | GaAs | None |

*not critical

The reference layers given in the table indicate that those layers in FIG. 1 correspond to the layer given in the table. Thus, the layer in the table must be doped as described with regards to FIG. 1.

Since they will be completely etched away, it is not necessary to grow the layers 110 and 111. However, the layers 110 and 111 facilitate testing of the topmost active region as a single-wavelength emitter prior to the fabrication of a multicolor device. Also, growing the layer 110 on top of the layer 109 helps to maintain the cleanliness of the top surface of the layer 109.

Figure 3:
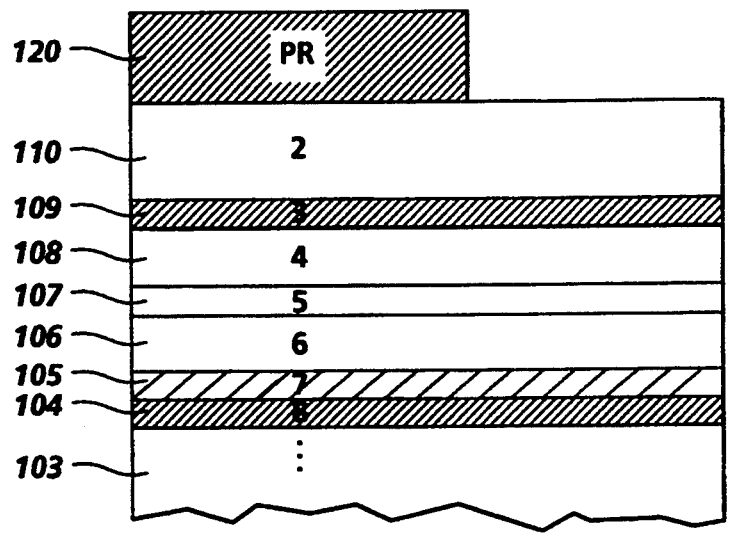
FIG. 3 shows the upper part of the structure of FIG. 2 after an etching step and deposition of an etch mask.

After fabrication of the structure shown in FIG. 2, the layer 111 is removed using a suitable etchant (see also FIG. 3). A suitable etchant is one that selectively etches layer 111 much more quickly than the layer 110; etchants such as citric acid:hydrogen peroxide or ammonium hydroxide:hydrogen peroxide having ratios of constituents such that they etch layer 111 (GaAs) much faster than layer 110 ($Al_{0.85}Ga_{0.15}As$) are acceptable. Alternatively, it would be possible to use an etchant that etches both layers 111 and 110, but with an etch time such that all of layer 111, but only part of layer 110, is removed. An example of such an etchant is the commonly used etchant system of sulfuric acid:hydrogen peroxide:water.

Figure 4:
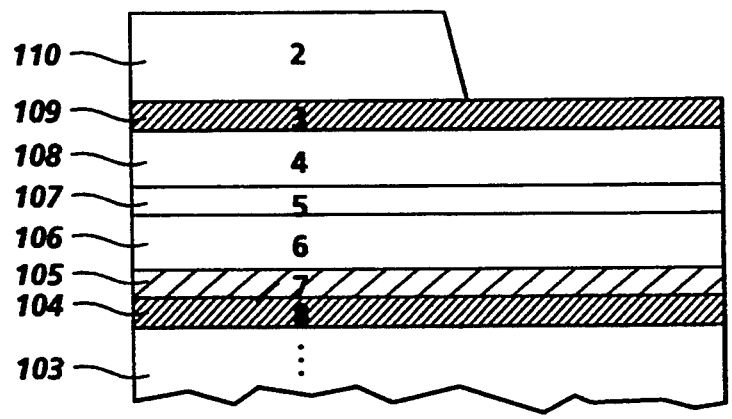
FIG. 4 shows the structure of FIG. 3 after an etching step and removal of the remaining etch mask.

Referring now to FIGS. 2 and 3, after removal of the layer 111, the top surface of the resulting structure is patterned, using a suitable etch mask 120, such as a photoresist, with openings where it is desired to locate the first stack (in FIG. 1, layers 14 through 26 inclusive) and part of the confinement region 54 on either side of the first stack. A selective etchant is then used to etch through the exposed layer 110 to the layer 109, the first etch stop layer. This selective etch could be a hydrofluoric acid based etchant such as buffered oxide etch. The etch masking layer (photoresist) is then removed, leaving an exposed portion of the layer 109 as shown in FIG. 4.

Figure 5:
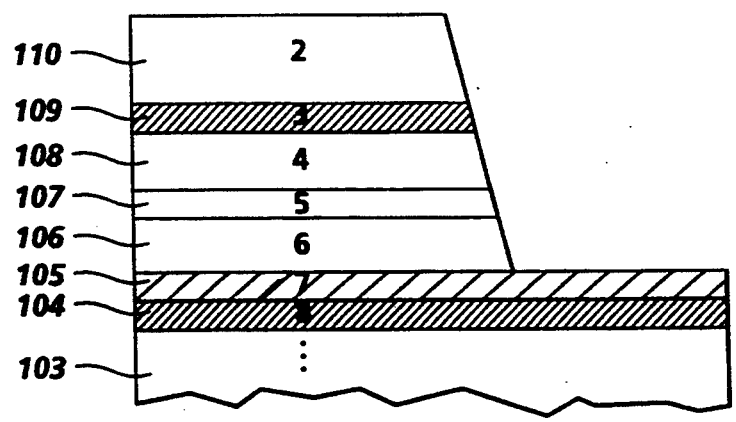
FIG. 5 shows the structure of FIG. 4 after an etching step.

The remaining and exposed portions of the layer 110 serve as an etch mask for the next etch step. That next etch removes the layers 109, 108, 107, and 106, from the area not under the layer 110, see FIG. 5. The preferred etchant is a citric acid/water:hydrogen peroxide mixture. To prepare that mixture, a citric acid solution is formed using equal parts, by weight, of citric acid monohydrate and water. Then, the citric acid/water solution is combined with hydrogen peroxide in a ratio of citric acid/water solution to peroxide of 16:1 by volume.

Figure 6:
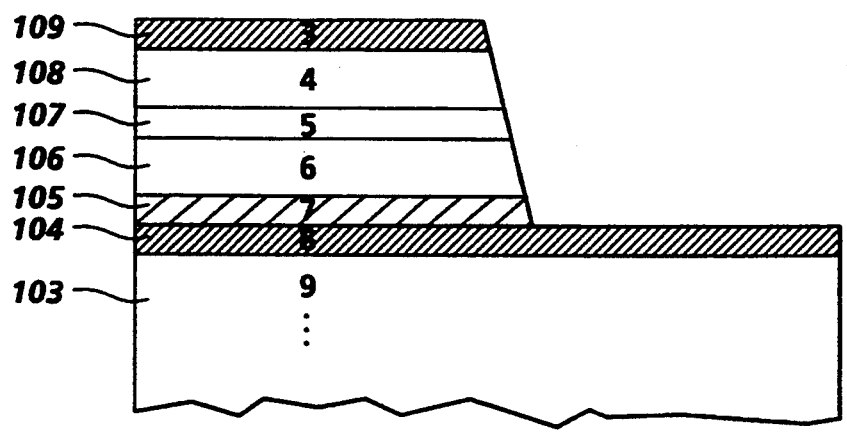
FIG. 6 shows the structure of FIG. 5 after an etching step.
Figure 7:
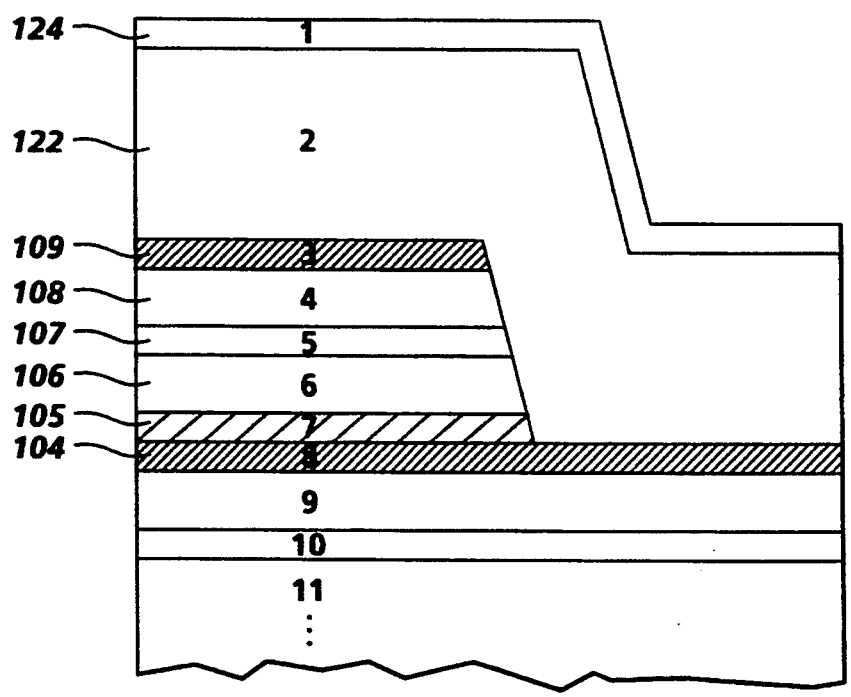
FIG. 7 shows the structure of FIG. 6 after growth of layers over the exposed surfaces.

Next, the exposed areas of layer 105 (see FIG. 5) and the remaining portions of the layer 110 are removed using a selective etchant, such as a buffered oxide etchant that etches the layers 110 and 105, but not the layer 104, see FIG. 6. Layers 122 and 124, similar to the layers 110 and 111, respectively, are then grown over the terraced surface formed by the layers 109 and 104 (in FIG. 6) to complete the epitaxial layer structure of the monolithic array shown in FIG. 1, see FIG. 7.

The etch stop layers 104 and 109 serve a dual purpose. First, they are barriers to the etchant that removes the layers above. Second, and importantly, they serve as relatively aluminum-free surfaces for the final growth. If these low-aluminum-containing layers were not included, the growth over exposed layers of higher-aluminum fraction would be problematic. In the case of the neighboring pair of etch stop layers 104 and 105, the lower layer, 104, facilitates the growth, while the layer 105 enables selective removal of the active region layers above it.

One particularly appealing advantage of fabricating a stacked active region monolithic laser array using the method given above is that, until the last etching step, the patterning and etching are carried out such that all regrowth surfaces in the growth plane are protected by an overlying epitaxial layer. Thus, the risk of contamination during the subsequent processing steps is reduced.

After growth of the layers 122 and 124, the confining regions 54 of FIG. 1 are formed using impurity-induced layer disordering. First, a layer of silicon nitride is deposited over the layer 124. Then, using an etch mask, the silicon nitride layer is removed from the areas into which silicon is to be diffused, thereby exposing portions of the layer 124. Next, a layer of silicon is deposited over the exposed portions of the layer 124 and the remaining silicon nitride layer. Then, another silicon nitride layer is formed over the just deposited silicon. Layer disordering proceeds by heating the structure in a furnace. The silicon in contact with the layer 124 is driven into the layers below, causing the desired disordering. Fabrication is then completed by providing separate contacts for each stack and cleaving to form the optical cavity.

From the foregoing, numerous modifications and variations of the principles of the present invention will be obvious to those skilled in its art. Therefore the scope of the present invention is to be defined by the appended claims.

What is claimed is:

1. A method of making a stacked laser comprising the steps of:
   (a) providing a semiconductor substrate;
   (b) forming a lower cladding layer over said semiconductor substrate;
   (c) forming over said lower cladding layer a first layered structure comprised of at least two active regions having different energy bandgaps and an etch stop layer disposed between said at least two active regions, said at least two active regions being stacked in order of decreasing energy bandgaps such that the active region having the highest energy bandgap is nearest said semiconductor substrate;
   (d) patterning said first structure to identify a stack position;
   (e) forming a second layered structure by etching at said stack position through said first layered structure to said etch stop layer with an etchant which does not etch said etch stop layer;
   (f) growing an upper cladding layer over the exposed surfaces of said second structure; and
   (g) forming a capping layer on said upper cladding layer.

2. The method according to claim 1 wherein said first and second active regions are comprised of $Al_xGa_{1-x}As$, wherein $0 \leq x \leq 1$.

3. The method according to claim 1 wherein said first and second active regions are comprised of $In_xGa_yAl_{1-x-y}As$, wherein $0 \leq x \leq 1$ and $0 \leq y \leq 1$.

4. The method according to claim 1, further including the step of forming a lateral optical confinement layer around said stack.

5. The method according to claim 1, further including the step of forming a lateral carrier confinement layer around said stack.

6. A method of making a stacked laser array comprising the steps of:
   (a) providing a semiconductor substrate;
   (b) forming a lower cladding layer over said semiconductor substrate;
   (c) forming over said lower cladding layer a first layered structure comprised of at least two active regions having different energy bandgaps and a first etch stop layer disposed between said at least two active regions, said at least two active regions being stacked in order of decreasing energy bandgaps such that the active region having the highest energy bandgap is nearest said semiconductor substrate;
   (d) patterning said first structure to identify first and second stack positions;
   (e) forming a second layered structure by etching at said first stack position through said first layered structure to said etch stop layer with an etchant which does not etch said etch stop layer;
   (f) forming a third structure by growing an upper cladding layer over the exposed surfaces of said second structure;
   (g) forming first and second capping layers on said upper cladding layer over said first and second stack positions, respectively;
   (h) forming first and second metallic contacts on said first and second capping layers, respectively; and
   (i) forming a common metallic contact over said substrate.

7. The method as claimed in claim 6, further including the step of forming a lateral optical confinement layer around said first and second stacks.

8. The method as claimed in claim 6, further including the step of forming a lateral carrier confinement layer around said first and second stacks.

9. The method of claim 6, wherein said first and second active regions are comprised of $Al_xGa_{1-x}As$, wherein $0 \leq x \leq 1$.

10. The method of claim 6, wherein said first and second active regions are comprised of $In_xGa_yAl_{1-x-y}As$, wherein $0 \leq x \leq 1$ and $0 \leq 1$.

* * * * *